United States Patent
Chang et al.

(10) Patent No.: US 7,432,204 B2
(45) Date of Patent: Oct. 7, 2008

(54) WAFER AND THE MANUFACTURING AND RECLAIMING METHODS THEREOF

(75) Inventors: Jen Chieh Chang, Hsinchu (TW); Yi Fu Chung, Hsinchu (TW); Pei-Feng Sun, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 349 days.

(21) Appl. No.: 10/917,696

(22) Filed: Aug. 13, 2004

(65) Prior Publication Data

US 2005/0248004 A1    Nov. 10, 2005

(30) Foreign Application Priority Data

May 10, 2004    (TW) ............... 93113073 A

(51) Int. Cl.
H01L 21/31     (2006.01)
H01L 23/12     (2006.01)
H01L 21/469    (2006.01)
H01L 21/8238   (2006.01)

(52) U.S. Cl. .............. 438/691; 438/692; 438/455; 438/693; 438/745; 438/750; 257/E21.567; 257/E21.57; 257/E21.209; 257/E21.682; 257/E27.103

(58) Field of Classification Search ......... 438/758, 438/458, 692, 238, 488, 691, 693, 745, 750, 438/927; 257/787, E21.166, E21.624, E21.648, 257/E21.012, 632, E21.244

See application file for complete search history.

(56) References Cited

U.S. PATENT DOCUMENTS

| | | | | |
|---|---|---|---|---|
| 3,923,567 A | * | 12/1975 | Lawrence | 438/4 |
| 5,631,197 A | * | 5/1997 | Yu et al. | 438/699 |
| 5,918,129 A | * | 6/1999 | Fulford et al. | 438/289 |
| 5,976,682 A | * | 11/1999 | Eichbauer | 428/213 |
| 5,976,982 A | * | 11/1999 | Levy et al. | 438/692 |
| 6,054,355 A | * | 4/2000 | Inumiya et al. | 438/296 |
| 6,171,910 B1 | * | 1/2001 | Hobbs et al. | 438/275 |
| 6,284,628 B1 | * | 9/2001 | Kuwahara et al. | 438/459 |
| 6,410,424 B1 | * | 6/2002 | Tsai et al. | 438/637 |
| 6,541,339 B1 | * | 4/2003 | Lin et al. | 438/266 |
| 6,559,055 B2 | * | 5/2003 | Tuan et al. | 438/692 |
| 6,613,676 B1 | * | 9/2003 | Yonehara et al. | 438/691 |
| 6,639,312 B2 | * | 10/2003 | Herner et al. | 257/701 |
| 7,064,376 B2 | * | 6/2006 | Shau | 257/315 |
| 2003/0162368 A1 | * | 8/2003 | Connell et al. | 438/465 |
| 2004/0104491 A1 | * | 6/2004 | Connell et al. | 257/787 |
| 2006/0270236 A1 | * | 11/2006 | Kusumoto et al. | 438/692 |

OTHER PUBLICATIONS

Semiconductor Processing Overview. 1998-TEEX, Revision #2-00A, Part # 8002M. ☐☐p. 105-106.*

* cited by examiner

Primary Examiner—Michael S. Lebentritt
(74) Attorney, Agent, or Firm—Townsend and Townsend and Crew LLP

(57) ABSTRACT

A wafer and the manufacturing and reclaiming methods thereof are disclosed. The wafer includes a semiconductor substrate and a protective layer formed on the surface of the semiconductor substrate. The reclaiming method of the wafer includes providing a wafer having a semiconductor substrate, a protective layer formed on the semiconductor substrate, and a polysilicon layer formed on the protective layer; and removing the polysilicon layer. The wafer and the reclaiming method of the wafer can prevent the substrate of the wafer from being destroyed during the reclaiming process and increase the reclaiming rate of the wafer.

16 Claims, 3 Drawing Sheets

WAFER AND THE MANUFACTURING AND RECLAIMING METHODS THEREOF

CROSS-REFERENCES TO RELATED APPLICATIONS

This application claims priority from R.O.C. Patent Application No. 093113073, filed May 10, 2004, the entire disclosure of which is incorporated herein by reference.

BACKGROUND OF THE INVENTION

The present invention relates to a wafer and manufacturing and reclaiming methods of the wafer, and more particularly to a control wafer or a dummy wafer and the manufacturing and reclaiming methods thereof.

In the semiconductor industry, the wafer for controlling the semiconductor fabrication is called a control wafer, and the wafer for maintaining the stability of single-batch fabrication is called a dummy wafer. For example, during the polysilicon deposition process in a furnace, the wafer for non-productive purposes (e.g., control wafer) and the wafer for productive purposes are put into the boat together to control the stability of batch-to-batch fabrication by measuring the thickness of the polysilicon deposited on the wafer for non-productive purposes. Moreover, the wafer for non-productive purposes (e.g., dummy wafer) and the wafer for productive purposes are put into the boat together to maintain the stability of single-batch fabrication. The wafer for non-productive purposes can promote the stability of the reactive airflow, so that the product can be uniformly deposited on the wafer.

For manufacturers, if the used control wafer or dummy wafer is not discarded as waste, then it could be reclaimed and reused as a control wafer or a dummy wafer. The reclaiming methods are described as follows. For example, Chemical Mechanical Polish (CMP) can be used to directly remove a deposition layer (e.g., polysilicon layer); however, the cost of such method is high (because the slurry is usually expensive), and the thickness of the wafer, will become thinner through the long-term use of this method, and furthermore, the wafer may be broken due to the mechanical stress in the polishing process. Other methods include Plasma Etching and Chemical Wet Dip that employs a $HNO_3$ solution and a HF solution, for example. Both methods can also directly remove the deposition layer (e.g., polysilicon layer). However, the materials used to remove the polysilicon layer may etch the silicon substrate as well, so that the damage to the silicon wafer occurs, and thus the reclaimed wafer will not be suitable for use as a control wafer or a dummy wafer. Moreover, if the availability of the etching and polishing machines is limited, the used wafers cannot be reclaimed as control wafers or dummy wafers immediately, so the manufacturers need to additionally buy new wafers in response thereto.

Therefore, it is desirable to develop a new wafer and its manufacturing and reclaiming methods to overcome the aforesaid problems and difficulties in prior art.

BRIEF SUMMARY OF THE INVENTION

Embodiments of the present invention provide a wafer and its manufacturing and reclaiming methods to overcome the shortcomings of the prior art, including high cost of the traditional reclaiming method, too many particles and brittleness on the surface of the reclaimed wafer, or discolor phenomena and surface roughness, so as to prevent the damage to silicon substrate in the reclaiming process of the wafer and to increase the reclaiming rate.

The present invention can be illustrated in at least three aspects, including the method of reclaiming the used wafers, the method of manufacturing the control wafers or dummy wafers, and the control wafers and so on.

The features of the present invention include: 1) preventing the thinness and breakability of the wafer due to the reclaiming process, 2) prolonging the use-span of the wafer, 3) reducing the limit of the use of machines, and 4) other improvements as described below.

The present invention will be illustrated in the following drawings and embodiments, but the processes, steps, materials, sizes, structures or other optional parts described in the embodiments are not used to confine the present invention; furthermore, the present invention is defined by the appended claims.

DETAILED DESCRIPTION OF THE INVENTION

Some typical embodiments to present the features and advantages of the present invention will be particularly described in the following illustrations. It should be understood that the present invention may have various modifications in different modes, which are not apart from the scope of the present invention, and the illustrations and drawings of the present invention are substantially used for explaining but not for limiting the present invention.

The wafer provided by embodiments of the present invention is applied in electronic component fabrication to improve the quality of the deposition process (e.g., polysilicon deposition process). The wafer can be considered as the control wafer or the dummy wafer. For example, the wafer can be put into the furnace together with the wafer for productive purposes to process the polysilicon deposition. Thereby, according to the thickness of polysilicon deposited on the control wafer, the stability of fabrication can be controlled, or via the dummy wafer, the reactive airflow can be stabilized and the product can be uniformly deposited on the wafer so as to maintain the stability of single-batch fabrication. The following embodiments use the control wafer as an example to illustrate the structure and the manufacturing and reclaiming methods of the wafer in the present invention.

Figure 1A:
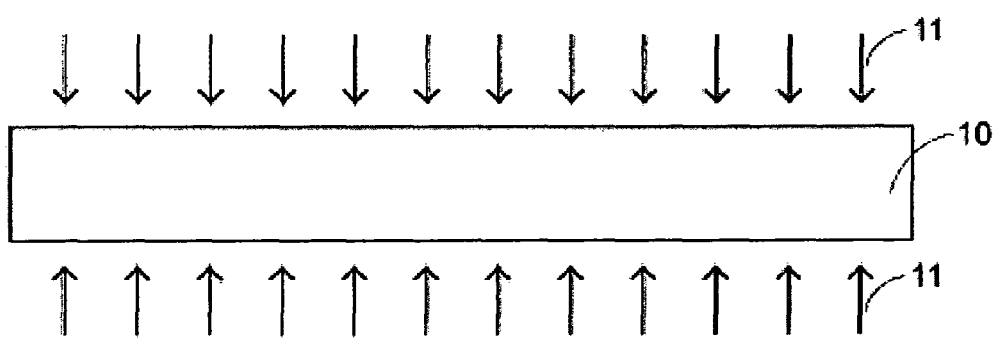
FIGS. 1(a)-(b) are schematic views showing a control wafer and its manufacturing method according to an embodiment of the present invention.
Figure 1B:
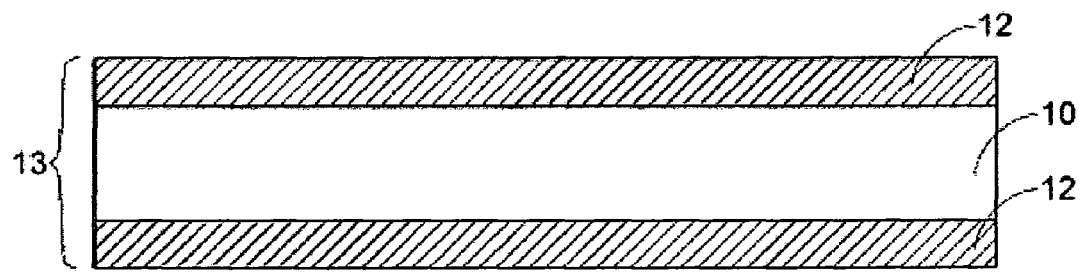
Figure 2A:
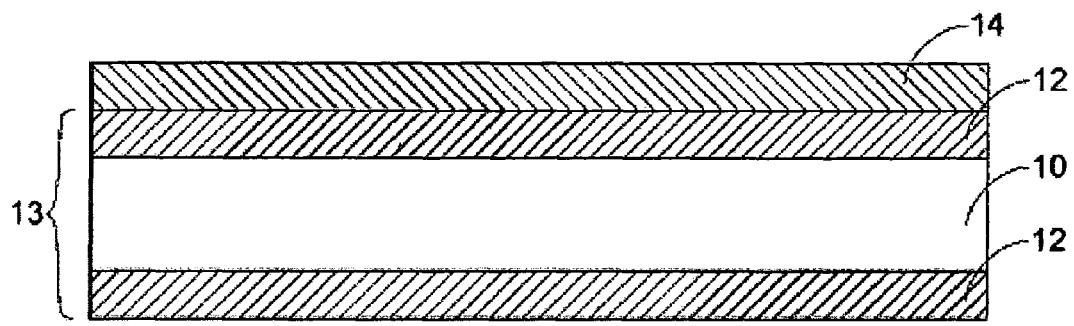
FIGS. 2(a)-(e) are schematic views showing the reclaiming method of the wafer according to another embodiment of the present invention.
Figure 2B:
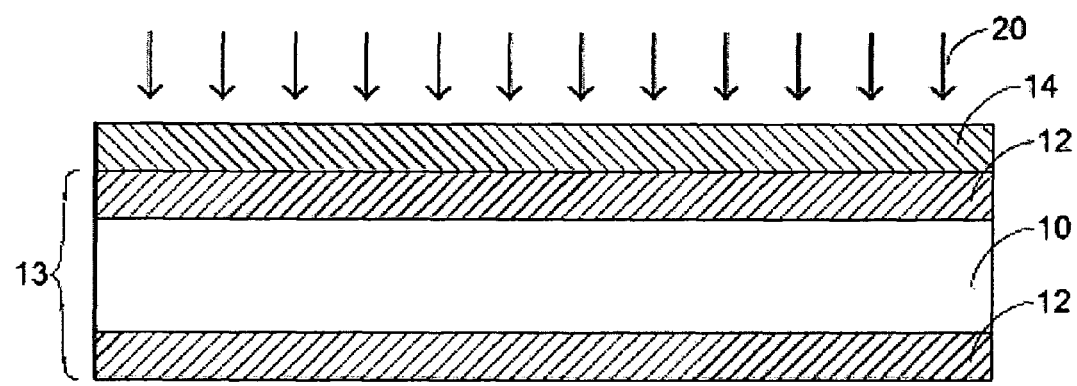
Figure 2C:
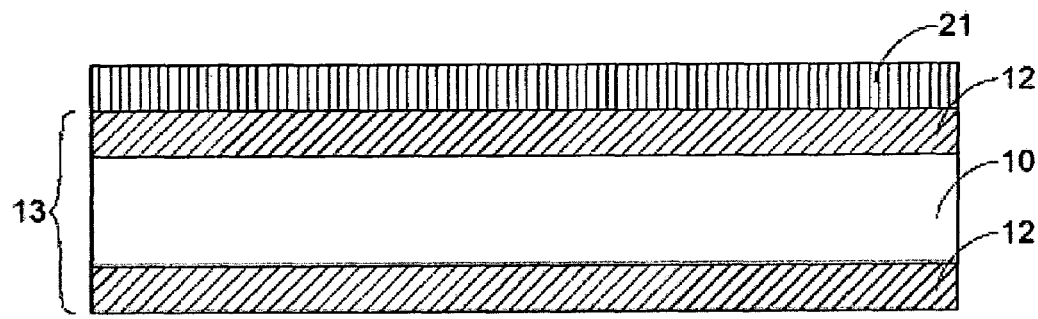
Figure 2D:
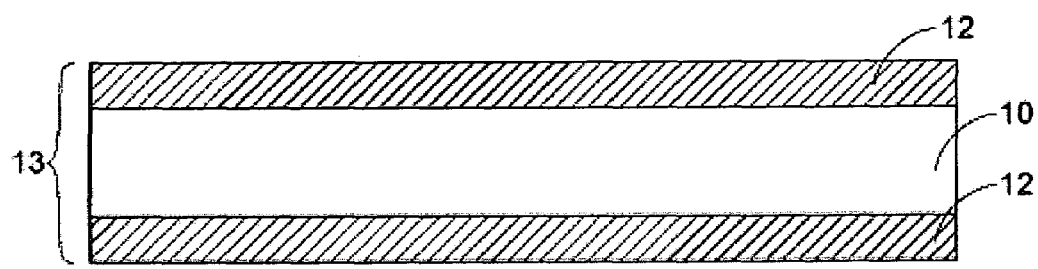
Figure 2E:
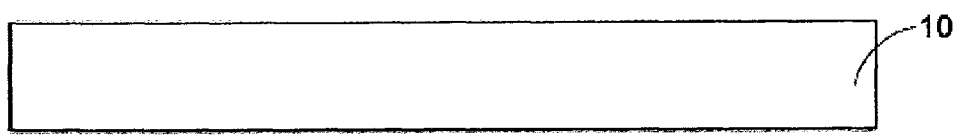

FIGS. 1(a)-(b) are schematic views showing a control wafer and its manufacturing method according to a specific embodiment of the present invention.

As shown in FIG. 1(a), first, a substrate 10 is provided (e.g., silicon substrate), and a chemical vapor deposition 11 is performed on the upper and lower surfaces of the substrate 10. As shown in FIG. 1(b), protective layers 12 are respectively formed on the upper and lower surfaces of the substrate 10 to prevent the destruction of the substrate 10 during the following reclaiming process of the wafer. In one embodiment, the protective layer 12 can be a silicon nitride layer formed by the deposition process 11 (e.g., chemical vapor deposition) with $NH_3$ gas and $SiH_2Cl_2$ gas. In some embodiments, the chemical vapor deposition can be performed on the machine, TEL IW-6C, made by the Japanese company, TOKYO ELECTRON LIMITED. In some other embodiments, the conditions for the chemical vapor deposition, for example, are that:

the flow rate of $SiH_2Cl_2$ gas is about 40 sccm, the flow rate of NH3 gas is about 400 sccm, the operative temperature is about 750° C., and the pressure is about 0.3 torr, so that the protective layer 12 with a thickness of about 2000 Å can be formed. The protective layer 12 can also be formed on the side surfaces of the wafer.

The control wafer 13 having the protective layers 12 is put into the furnace together with the wafer for productive purpose (not shown) to perform the deposition process (e.g., polysilicon deposition process). According to the deposition thickness on the control wafer 13, the stability of fabrication can be controlled to further promote the quality of the deposition process. The control wafer can be considered as the dummy wafer.

FIGS. 2(*a*)-(*e*) are schematic views showing the reclaiming method of the wafer according to another embodiment of the present invention. As shown in FIG. 2(*a*), first, a control wafer 13 after the deposition process (e.g., polysilicon deposition process) is provided. The control wafer 13 has a semiconductor substrate 10 and protective layers 12 as shown in FIG. 1(*b*); a deposition layer 14 is further formed on the surface of the protective layer 12, as shown in FIG. 2(*b*). In some embodiments, the deposition layer 14 is a polysilicon layer formed by a chemical vapor deposition when the control wafer 13 is put into a furnace.

The deposition layer 14 can be formed on the upper, lower or side surfaces of the wafer, but it is only shown on one surface of the wafer in the drawings of the embodiments. In fact, the following described process also has similar effects on another surface or side surface of the wafer.

Next, an oxidation process 20 is performed on the deposition layer 14 to oxidize the deposition layer 14 into an oxide layer 21 (e.g., silicon dioxide layer) as shown in FIG. 2(*c*). Then, the oxide layer 21 is removed from the surface of the protective layer 12 (e.g., by etching process) as shown in FIG. 2(*d*). In some embodiments, the polysilicon deposition layer 14 can be oxidized into an oxide layer 21 through a thermal oxidation method. In some other embodiments, the etching process can be a wet etching process. Further, in one of the embodiments, a solution containing HF can be used as an etchant to remove the oxide layer 21.

In some embodiments, the thermal oxidation can be performed on the machine, TEL IW-6C, made by a Japanese company, TOKYO ELECTRON LIMITED. In some other embodiments, the conditions for the thermal oxidation, for example, are that: the operative temperature is about 1050° C., the flow rates of $H_2$ and $O_2$ are respectively about 5500 sccm and 3300 sccm, the pressure is about 760 torr, and the reaction time is about 10 hours, so that the polysilicon layer 14 can be oxidized to become an oxide layer 21 (e.g., silicon dioxide layer) with a thickness of about 5000 Å.

In some embodiments, a solution containing about 49% by weight of HF can be used in the wet etching process, and the operative temperature is about 25° C., but not limited thereto, to remove the oxide layer 21.

Since the etching rate of a HF solution to the silicon nitride protective layer 12 is very low, when the solution containing HF is used to remove the oxide layer 21, the protective layer 12 (e.g., silicon nitride layer) can serve as an etch-stop layer without being destroyed by the solution containing HF, so it can prevent the solution from entering the substrate 10 and further protect the substrate 10, and the polysilicon deposition layer 14 can be completely removed. Therefore, the control wafer 13 having the protective layers 12 can be reclaimed and reused.

As shown in FIG. 2(*e*), the silicon nitride protective layers 12 can be removed (e.g., by an etching process) to form a bare wafer for reclaiming purpose. In some embodiments, the etching process is a wet etching process. In one embodiment, a solution containing $H_3PO_4$ can be used as an etchant, and the operative temperature is about 160° C., but not limited thereto. The control wafer 13 is etched to remove the protective layers 12 from the surfaces of the substrate 10, so that the wafer can be reclaimed to be reused in the fabrication process or reused as a control wafer or a dummy wafer.

The polysilicon deposition layer 14 of the present embodiment can be a doped polysilicon, an undoped polysilicon, or an amorphous polysilicon layers.

In some embodiments, the chemical vapor deposition for the doped polysilicon can be performed on the machine, TEL IW-6C, made by the Japanese company, TOKYO ELECTRON LIMITED. In a specific embodiment, the conditions for the chemical vapor deposition, for example, are that: the flow rate of $SiH_4$ gas is about 1000 sccm, the flow rate of $PH_3$ gas is about 125 sccm, the operative temperature is about 575° C., and the pressure is about 0.5 torr, so that an n-doped polysilicon layer with a thickness of about 500-8000 Å can be formed.

In some embodiments, the polysilicon deposition layer 14 can be a composite layer of the undoped polysilicon and n-doped polysilicon. In specific embodiments, the chemical vapor deposition can be performed on the machine, TEL IW-6C, made by the Japanese company, TOKYO ELECTRON LIMITED, and the conditions, for example, are that: the flow rate of $SiH_4$ gas is about 190 sccm, the operative temperature is about 620° C., and the pressure is about 0.25 torr, so that an undoped polysilicon layer with a thickness of about 500-8000 Å can be formed. In some other embodiments, the chemical vapor deposition can also be performed on the machine, TEL IW-6C, made by the Japanese company, TOKYO ELECTRON LIMITED, and the conditions, for example, are that: the flow rate of $O_2$ gas is about 500 sccm, the operative temperature is about 800° C., and phososhoryl chloride ($POCl_3$) is doped to form an n-doped polysilicon layer.

In some embodiments, the chemical vapor deposition for the undoped polysilicon can be performed on the machine, TEL IW-6C, made by the Japanese company, TOKYO ELECTRON LIMITED, and the conditions, for example, are that: the flow rate of $SiH_4$ gas is about 190 sccm, the operative temperature is about 620° C., and the pressure is about 0.25 torr, so that an undoped polysilicon layer with a thickness of about 500-8000 Å can be formed; or, in another embodiment, the conditions, for example, are that: the flow rate of $SiH_4$ gas is about 155 sccm, the operative temperature is about 575° C., and the pressure is about 0.2 torr, so that a rugged polysilicon layer with a thickness of about 500-8000 Å can be formed. In some embodiments, the chemical vapor deposition for the amorphous polysilicon can be performed on the machine, TEL IW-6C, made by the Japanese company, TOKYO ELECTRON LIMITED, and in one embodiment, the conditions, for example, are that: the flow rate of $SiH_4$ gas is about 190 sccm, the operative temperature is about 550° C., and the pressure is about 0.25 torr, so that an amorphous polysilicon layer with a thickness of about 500-8000 Å can be formed.

In conclusion, embodiments of the present invention provide a wafer and its manufacturing and reclaiming methods, in which protective layers are formed on the surfaces of a semiconductor substrate of the wafer. In the reclaiming process of the wafer, the protective layer can serve as an etch-stop layer to prevent the damage to the semiconductor substrate when the polysilicon layer is removed by a wet etching process, so that the wafer can be reclaimed and reused; moreover, the reclaiming rate can be enhanced.

While the invention has been described in terms of what is presently considered to be the most practical and preferred embodiments, it is to be understood that the invention need not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method of manufacturing a non-productive wafer, comprising:

providing a semiconductor substrate;

simultaneously forming a first protective layer on a first surface of said semiconductor substrate, and a second protective layer on a second surface of said semiconductor substrate;

forming a polysilicon layer on said semiconductor substrate;

oxidizing said polysilicon layer so as to form an oxide layer; and removing said oxide layer;

wherein said non-productive wafer is used to improve the quality of a deposition process of polysilicon on one or more productive wafers by subjecting the non-productive wafer to the polysilicon deposition process performed on the productive wafers, wherein the protective layer protects the semiconductor substrate from damage during removal of said oxide layer from the non-productive substrate to reclaim the non-productive wafer, and wherein said protective layer is a silicon nitride layer formed by a chemical vapor deposition process, said chemical vapor deposition process employing $SiH_2Cl_2$ gas or $NH_3$ gas.

2. A method for reclaiming a non-productive wafer, comprising:

simultaneously forming a first silicon nitride layer over a first surface of a substrate and a second silicon nitride layer over a second surface over a second surface of the substrate;

forming a polysilicon layer over the first silicon nitride layer;

oxidizing the polysilicon layer so as to form an oxide layer; and removing the oxide layer.

3. The method of claim 2, wherein forming the first silicon nitride layer comprises forming the first silicon nitride layer continuously extending from an edge of the substrate to an opposing edge of the substrate.

4. The method of claim 2, wherein forming the polysilicon layer comprises forming the polysilicon layer continuously extending from an edge of the substrate to an opposing edge of the substrate.

5. The method of claim 2, wherein forming the first silicon nitride layer comprises forming the second silicon nitride layer continuously extending from an edge of the substrate to an opposing edge of the substrate.

6. The method of claim 2, wherein oxidizing the polysilicon layer includes a thermal oxidation step.

7. The method of claim 2, wherein removing the oxide layer is a wet etch process.

8. The method of claim 7, wherein the wet etch process uses hydrogen fluoride (HF).

9. The method of claim 2, wherein the substrate is a control wafer or a dummy wafer.

10. The method of claim 2, wherein forming the first silicon nitride layer uses $SiH_2Cl_2$ gas or $NH_3$ gas.

11. The method of claim 2 further comprising removing the first silicon nitride layer after removing the oxide layer.

12. The method of claim 2 wherein forming the polysilicon layer is carried out in a furnace having productive wafers and non-productive wafers.

13. The method of claim 2 further comprising using the non-productive wafer to improve a quality of a polysilicon deposition process, the polysilicon deposition process being used in forming the polysilicon layer.

14. The method of claim 13 further comprising using a thickness of the polysilicon layer to control stability of the polysilicon deposition process.

15. The method of claim 1, wherein the first protective layer and the second protective layer are configured to protect the semiconductor substrate free from losing thickness.

16. The method of claim 2, wherein the first silicon nitride layer and the second silicon nitride layer are configured to protect the substrate free from losing thickness.

* * * * *